US007883991B1

(12) United States Patent
Wu et al.

(10) Patent No.: US 7,883,991 B1
(45) Date of Patent: Feb. 8, 2011

(54) TEMPORARY CARRIER BONDING AND DETACHING PROCESSES

(75) Inventors: Wen-Jin Wu, Hsinchu (TW); Wen-Chih Chiou, Miaoli (TW); Shau-Lin Shue, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/707,752

(22) Filed: Feb. 18, 2010

(51) Int. Cl.
*H01L 21/30* (2006.01)
*H01L 21/46* (2006.01)

(52) U.S. Cl. ....................... 438/459; 438/455; 438/107; 438/108; 438/109; 438/118; 257/686; 257/777; 257/783

(58) Field of Classification Search ................. 438/455, 438/458, 459, 118, 110, 107, 108, 109; 257/E27.137, 257/E21.122, 778, 782, 686, 777, 783
See application file for complete search history.

(56) References Cited

U.S. PATENT DOCUMENTS 7,462,551 B2 12/2008 Kulkarni et al.
2006/0292887 A1* 12/2006 Hara .......................... 438/753

* cited by examiner

*Primary Examiner*—Thao X Le
*Assistant Examiner*—Thanh Y Tran
(74) *Attorney, Agent, or Firm*—Lowe Hauptman Ham & Berner, LLP

(57) ABSTRACT

A method of bonding and detaching a temporary carrier used for handling a wafer during the fabrication of semiconductor devices includes bonding a wafer onto a carrier through a first adhesive layer and a second adhesive layer, in which the edge zone of the wafer and the carrier is covered by the first adhesive layer while the edge zone is not covered by the second adhesive layer. A wafer edge clean process is then performed to remove the first adhesive layer adjacent the edge of the wafer and expose the edge zone of the carrier, followed by removing the second adhesive layer from the carrier. After detaching the carrier from the wafer, the first adhesive layer remaining on the wafer is removed.

20 Claims, 15 Drawing Sheets

200b" 204 200" 300

404 402a 200" 202e 202 300e 302 300

TEMPORARY CARRIER BONDING AND DETACHING PROCESSES

TECHNICAL FIELD

This disclosure relates to the fabrication of semiconductor devices, and more particularly, to a method of bonding and detaching a temporary carrier used for handling a thinned wafer during the fabrication of semiconductor devices.

BACKGROUND

Semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. Three-dimensional (3D) integrated circuits (ICs) are therefore created to resolve the limitations of the number and length of interconnections between devices as the number of devices increases. Dies-to-wafer stack bonding is one method for forming 3D ICs, wherein one or more die is bonded to a wafer, and the size of dies may be smaller than the size of chips on the wafer. In order to reduce the thickness of semiconductor packages, increase the chip speed, and for high-density fabrication, efforts to reduce the thickness of a semiconductor wafer are in progress. Accordingly, one of the important aspects of 3D technology process is how to handle wafer thinning. A typical process for temporary bonding involves the carrier wafer and/or the device wafer being coated with an adhesive, bonding of the device wafer and the carrier, processing of the device wafers and then removal of the carrier.

Thickness reduction is performed by so-called backside grinding of a semiconductor wafer on the surface opposite that containing pattern-formed circuitry, on which a carrier is typically attached to support wafer handling through an adhesive material. Because the thinned wafer tends to have insufficient strength and is more susceptible to deformation such as bending and/or warping, a surface of the wafer is then encapsulated in a molding compound (e.g., thermo-curing epoxy resin), prior to the wafer being separated into individual chip packages using a dicing process. However, conventional method exposes a portion of the adhesive material at the wafer edge, so that the wafer edge is easily attacked in subsequent etching process, e.g., a wet etch or dry etch process to become chipped after detaching the carrier. Especially when a thermosetting adhesive material is used, the device wafer backside process with high temperature makes the adhesion strength stronger than that of low-k film in the device wafer so as to induce damages to the low-k film during the carrier detaching process. Also, the adhesive material may get lower viscosity during the backside process, so that the adhesive may flow into the glass carrier to arise other issues.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
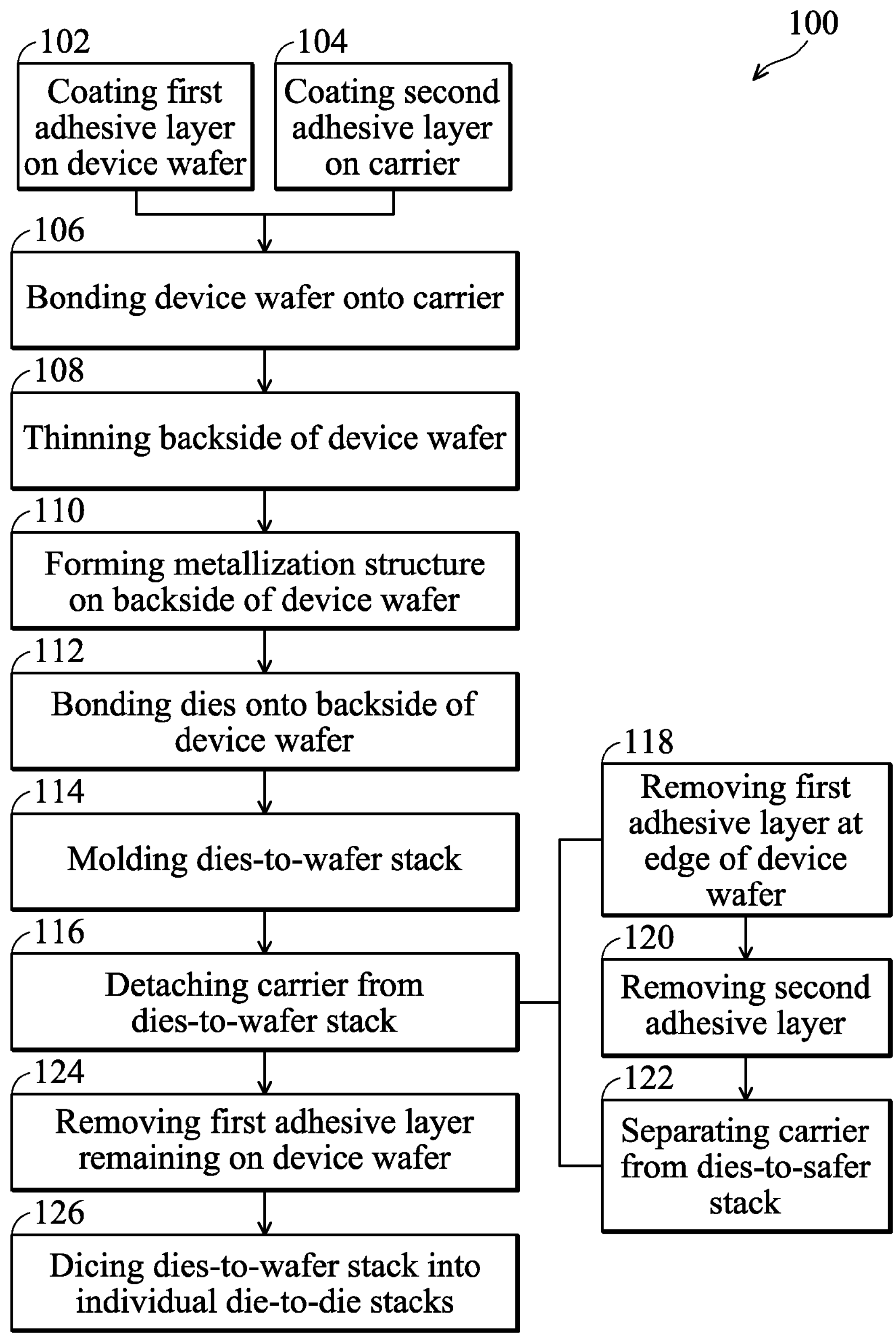
FIG. 1 is a flowchart of an exemplary embodiment of fabricating vertical die-to-die stacks including bonding and detaching a temporary carrier.

Referring to FIG. 1, illustrated is a flowchart of an exemplary embodiment of fabricating vertical die-to-die stacks including bonding and detaching a temporary carrier. Referring to FIG. 2A to FIG. 2K, illustrated are cross-sectional views of an exemplary embodiment of fabricating die-to-die stacks at various stages according to the method of FIG. 1.

Figure 2A:
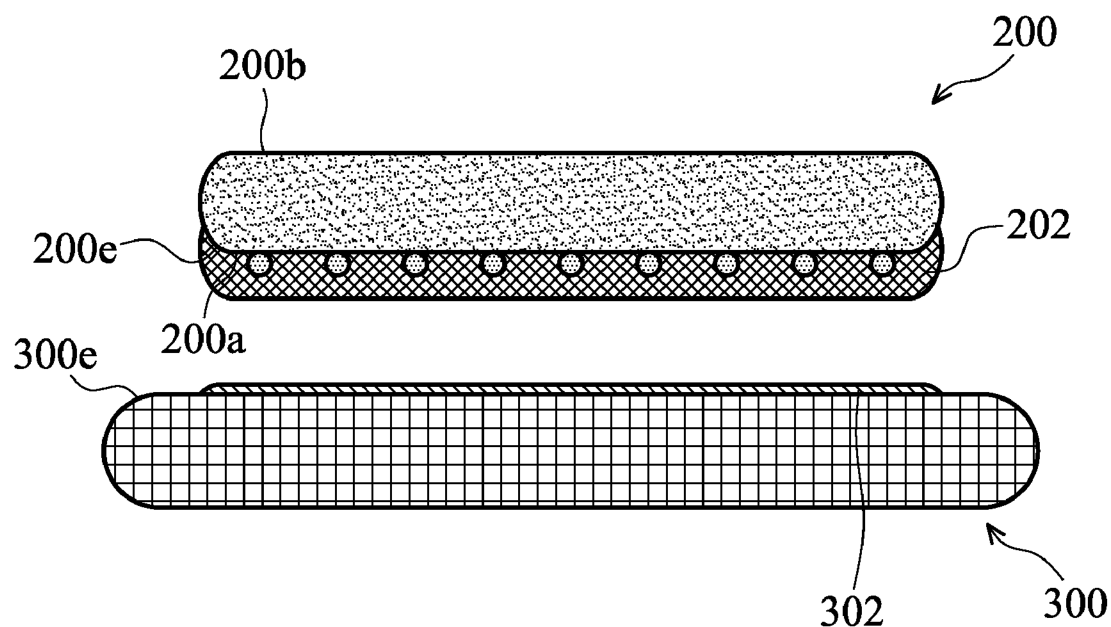
FIG. 2A to FIG. 2K are cross-sectional diagrams depicting an exemplary embodiment of fabricating die-to-die stacks at various stages according to the method of FIG. 1.

The method 100 begins with step 102 of coating a first adhesive layer on a device wafer, and then continues with step 104 of coating a second adhesive layer on a carrier. FIG. 2A is a cross-sectional view depicting one embodiment of a device wafer 200 coated with a first adhesive layer 202 for being attached to a carrier 300 coated with a second adhesive layer 302. The device wafer 200 is provided with a plurality of semiconductor chips therein, wherein each die includes a substrate having electronic devices formed thereon as is known in the art. The substrate may be formed of a semiconductor material, silicon, gallium arsenide, a rock crystal wafer, sapphire, glass, quartz, ceramic, thermosetting materials, or the like. The substrate is typically covered with one or more dielectric layers and conductive layers. The conductive layers provide connectivity and routing for the underlying electronic devices. The device wafer 200 has a first side 200*a* and a second side 200*b* opposite to the first side 200*a*. On the first side 200*a*, integrated circuits including active and passive devices such as transistors, resistors, capacitors and the like, are formed to connect bond pads and/or other interconnection structures.

The first adhesive layer 202 is placed over the first side 200*a* in order to adjoin the device wafer 200 to the carrier 300. In an embodiment, the first adhesive layer 202 covers the edge 200*e* of the first side 200*a* of the device wafer 200. The first adhesive layer 202 is a single layer, a multi-layered adhesive structure or composite layers applied in spin-on or lamination process, in which at least one adhesive layer includes wet-chemical removable adhesive, such as thermal plastic material, solvent soluble material. Other types of adhesives, such as pressure sensitive adhesives, radiation curable adhesives, epoxies, combinations of these, or the like, may also be used. The adhesive layer may be placed onto the surface in a semi-liquid or gel form, which is readily deformable under pressure. The first adhesive 202 may be easily stripped mechanically or chemically.

The carrier 300 may be made of removable or dissolvable materials, for example, silicon, glass, quartz, ceramic, silicon oxide, aluminum oxide, polymer, plastic, an acrylic-based material, any other translucent material, or combinations of any of these materials. The carrier 300 is planar in order to accommodate its attachment to the device wafer 200. The carrier 300 may have a thickness of between about 550 μm and about 850 μm. The carrier 300 may have a diameter that is greater than the device wafer 200, while the size of the carrier 300 will be in some ways dependent upon the size of the device wafer 200. The carrier 300 provides mechanical support for the device wafer 200 during handling and processing and is translucent so as to allow radiation, for example laser or ultraviolet radiation, to pass through it.

The second adhesive layer 302 is placed over the carrier 300 in order to adjoin the device wafer 200 to the carrier 300. In an embodiment, the second adhesive layer 302 covers the main portion of the carrier 300, except for the edge zone 300*e* of the carrier 300. The second adhesive layer 302 may include a single layer or composite layers applied in spin-on or lamination process. In one embodiment, the second adhesive layer 302 is formed of a light-decomposable adhesive, for example laser sensitive material, UV sensitive material, or thermal decomposed material, which can be decomposed to lose its adhesive property when exposed to a light-form energy, such as IR (infrared radiation), laser, UV, or the like and heat form energy. In another embodiment, the second adhesive layer 302 is formed of a solvent-resolved adhesive for example thermal plastic material, which can be resolved by solvent such as photo resist related solvent (such as PGMEA, NMP).

Figure 2B:
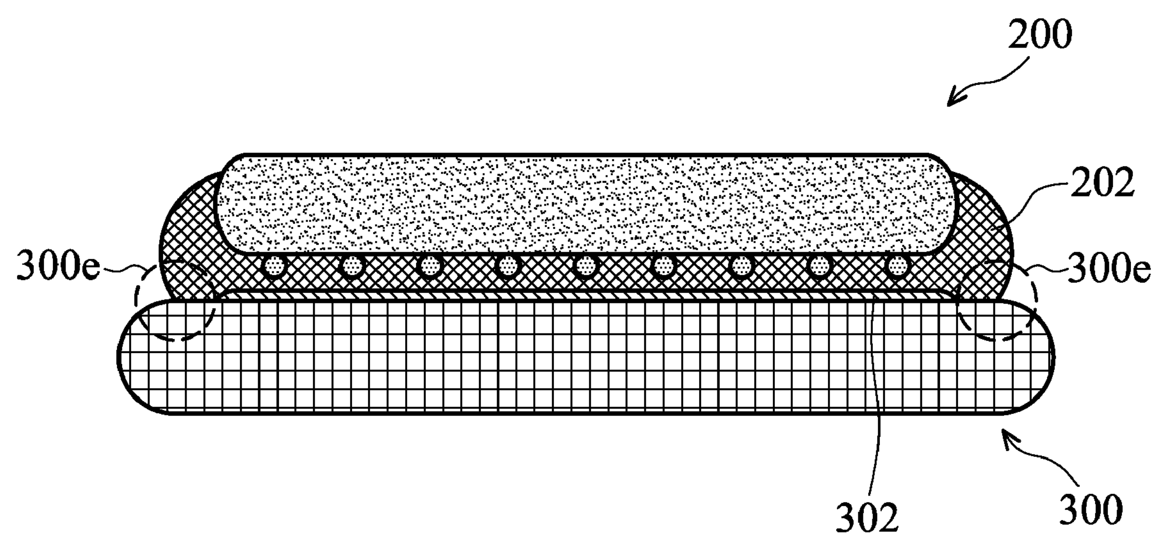

The method 100 continues with step 106 of bonding the device wafer onto the carrier. FIG. 2B is a cross-sectional view depicting the device wafer 200 flipped and bonded onto the carrier 300 through the adhesive layers 202 and 302 for enabling easier handling of the device wafer 200 in subsequent thinning and backside processes. The first adhesive layer 302 covers the second adhesive layer 302 and the edge zone 300*e* of the carrier 300.

Figure 2C:
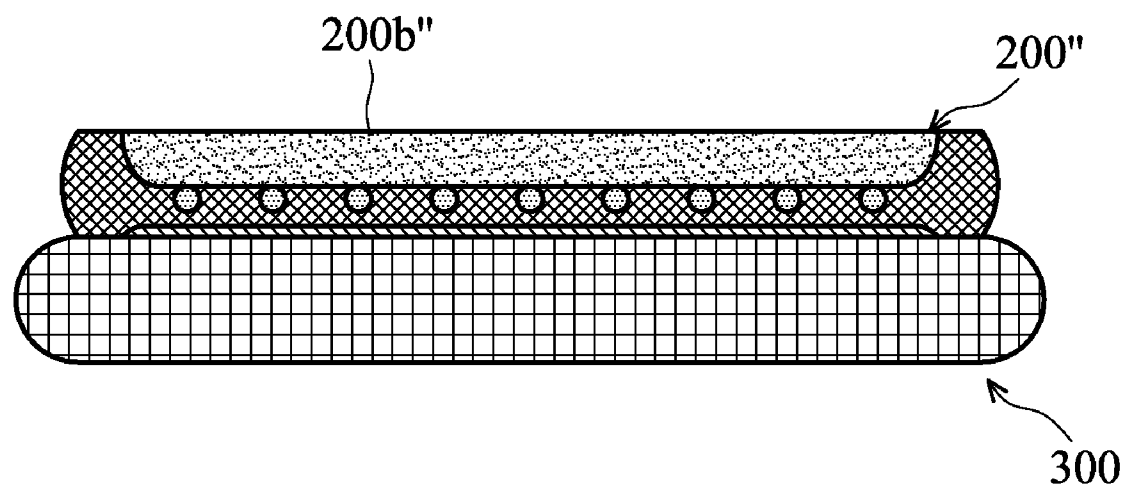

The method 100 continues with step 108 of thinning the backside of the device wafer. FIG. 2C is a cross-sectional view of the device wafer 200 undergoing a wafer thinning process. After attached to the carrier 300, the device wafer 200 is processed in its structure-free area (second side 200*b*) to the desired final thickness. This may be done, for example, through grinding, etching, and/or polishing, resulting in a thinned device wafer 200" with a predetermined thickness depending on the purpose for which the semiconductor package is used. In one embodiment, the device wafer 200 is thinned to a thickness of from about 5 μm to about 50 μm. In another embodiment, the device wafer 200 is thinned to a thickness of from about 25 μm to about 250 μm.

Figure 2D:
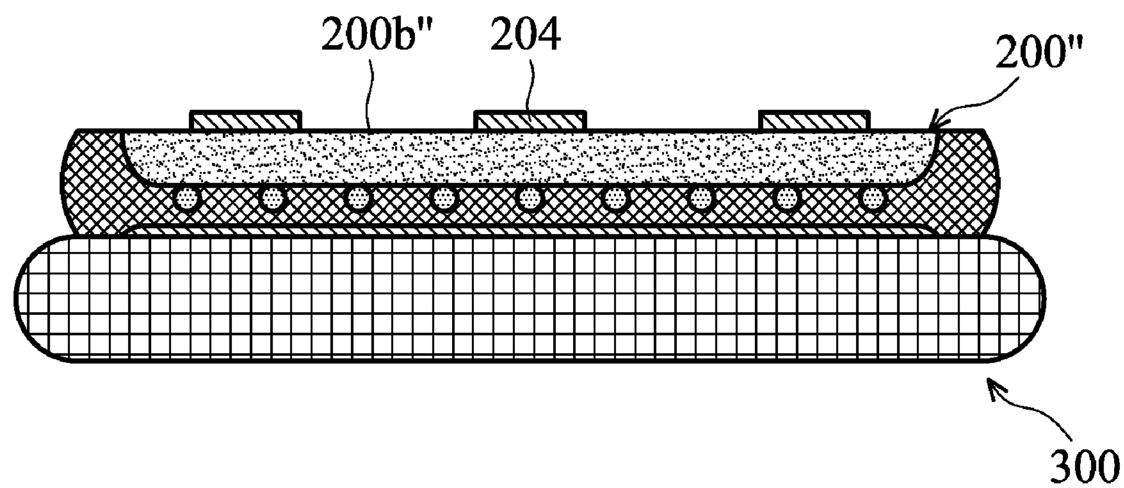

The method 100 continues with step 110 of forming a metallization structure on the backside of the device wafer. FIG. 2D is a cross-sectional views depicting a metallization structure 204 formed on the second side 200*b*" of the thinned device wafer 200". The backside metallization structure 204 includes interconnection structures (for example re-distribution lines (RDL)), external contact structures (e.g., solder bumps or copper-containing bumps of the individual semiconductor chips), and/or other structure functioning as power lines, inductors, capacitors or any passive components. The metallization structure 204 may be formed of copper, aluminum, copper alloy, or other mobile conductive materials by methods including plating, electroless plating, sputtering, chemical vapor deposition methods, and the like.

Figure 2E:
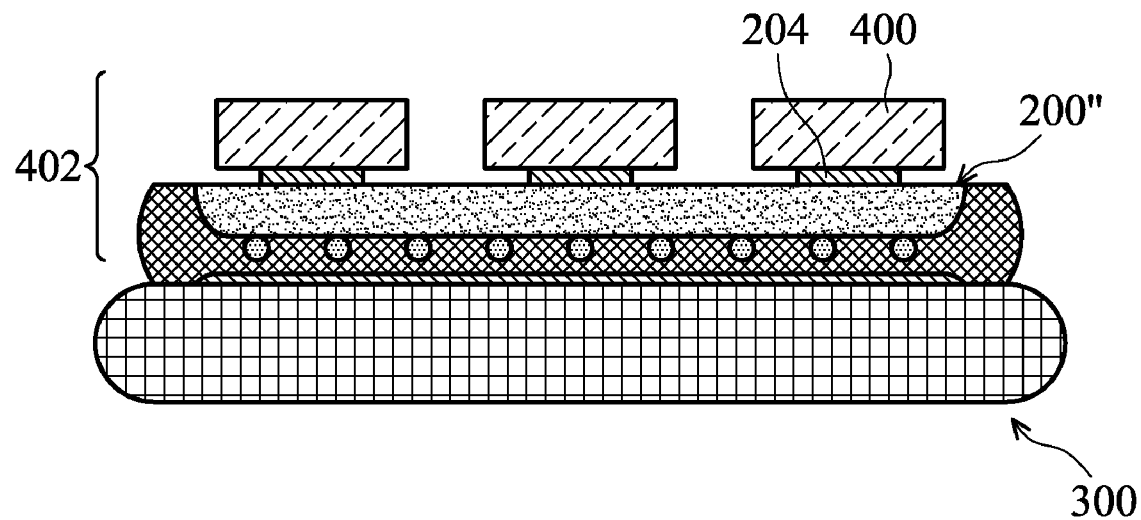

The method 100 continues with step 112 of bonding dies onto on the backside of the device wafer. FIG. 2E is a cross-sectional views depicting a plurality of dies 400 bonded onto and electrically connected to the metallization structures 204 on the second side 200*b*" of the thinned device wafer 200", forming a dies-to-wafer stack 402. The bonding methods include commonly used methods such as oxide-to-oxide bonding, oxide-to-silicon bonding, copper-to-copper bonding, adhesive bonding, solder material bonding and the like. The dies 400 may include memory chips, RF (radio frequency) chips, logic chips, or other chips. Each of the dies 400 has a first surface and a second surface, and integrated circuits are formed on the first surface. In one embodiment, the first surface of the die 400 is bonded onto the thinned wafer 200". In one embodiment, the second surface of the die 400 is bonded onto the thinned wafer 200".

Figure 2F:
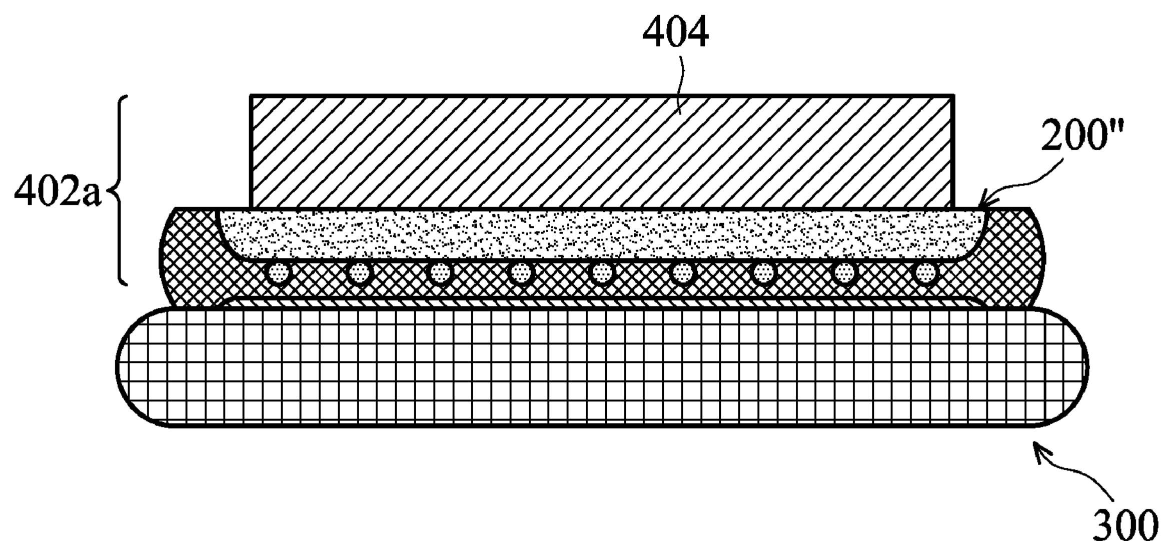

The method 100 continues with step 114 of molding the dies-to-wafer. FIG. 2F is a cross-sectional view depicting a molding process performed on the dies-to-wafer stack 402, forming a molded stack 402*a*. A molding compound 404 is coated over dies-to-wafer stack 402 and fills the remaining spacing between adjacent dies 400. The molding process may leave an uncovered region at the edge of the thinned wafer 200". The molding compound 404 is formed of a curable material such as, for example a polymer-based material, resin-based material, polyimide, silicon oxide, epoxy, benzocyclobutenes (BCB), Silk™ (Dow Chemical), or a combination thereof. The molding process includes injection molding, compression molding, stencil printing, spin-on coating, or future-developed molding processes. After coating the molding compound 404, a curing or baking step is performed to solidify protection material.

Figure 2G:
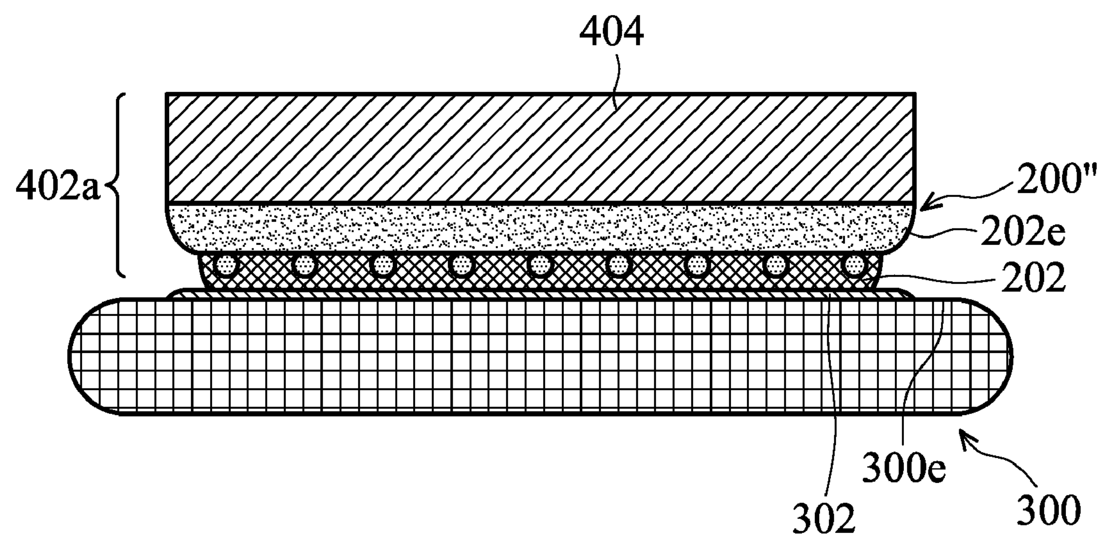
Figure 2H:
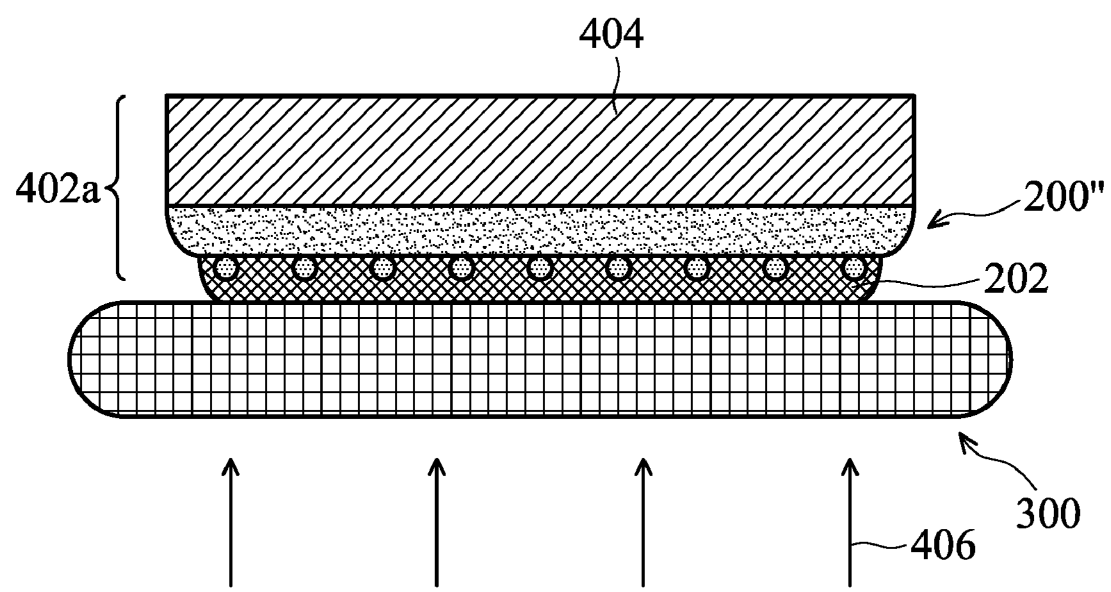
Figure 2I:
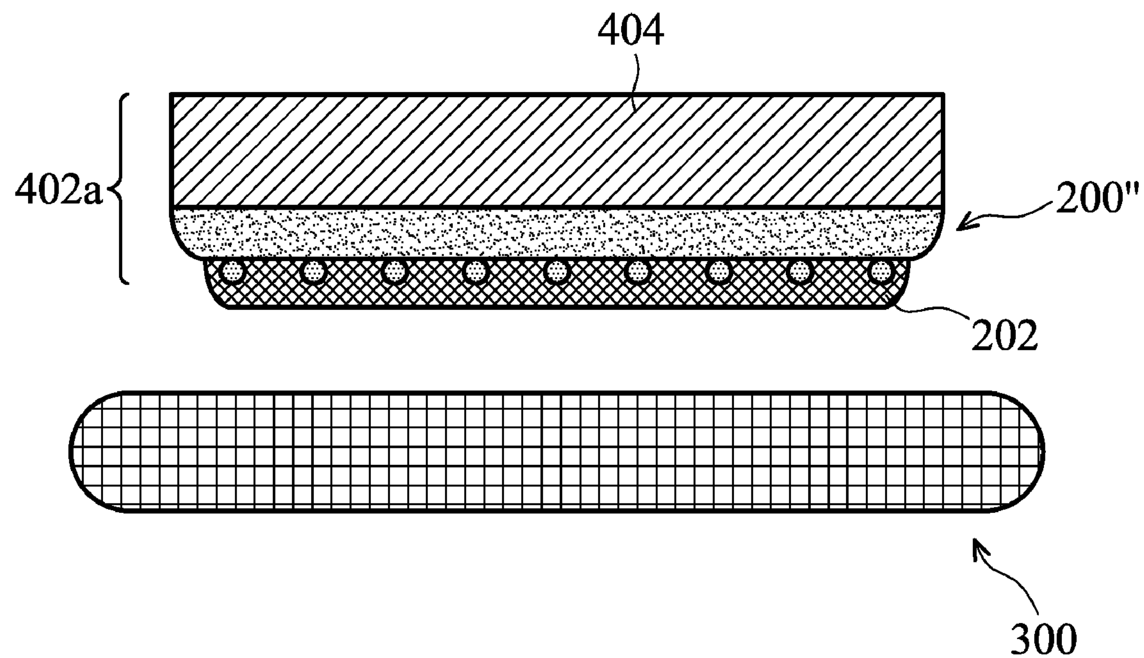

The method 100 continues with step 116 of detaching the carrier 300 from the molded stack 402*a*. FIG. 2G to FIG. 21 are cross-sectional views depicting various stages of the carrier detaching process. The step 116 begins with the step 118 of removing the first adhesive layer 202 at the edge 200*e* of the thinned device wafer 200"by a cleaning method to expose the edge zone 300*e* of the carrier 300 and the second adhesive layer 302 adjacent the edge zone 300*e* as depicted in FIG. 2G. The cleaning method may be a chemical jetting process or a wet bench process. The step 116 continues with the step 120 of removing the second adhesive layer 302. In one embodiment, the second adhesive layer 302 is removed by decomposition using a light source 406 as depicted in FIG. 2H. The light source 406 is directed at carrier 300 and is emitted to pass through the carrier 300, so that the second adhesive layer 302 is decomposed after absorbing the light-form energy. The light source 406 may include IR (infrared light), laser, radiation lamp, or the like. In other embodiment, the second adhesive layer 302 is removed by solvent resolved method, for example $NH_4OH$.

Typically after wafer-level testing has been completed, the step 116 continues with the step 122 of separating the carrier 300 and the molded stack 402*a* as depicted in FIG. 21. Since the second adhesive layer 302 is removed by decomposition or solvent, it become more easily to detach the carrier 300 from the thinned device wafer 200" without causing damages. The detaching process may use any appropriate de-bonding processes, such that the semiconductor structures in the thinned device wafer 200" retain their integrity. For example, the detaching process uses a solvent, by suing UV irradiation or by being pulled off to remove the carrier 300 from the first adhesive layer 202.

Figure 2J:
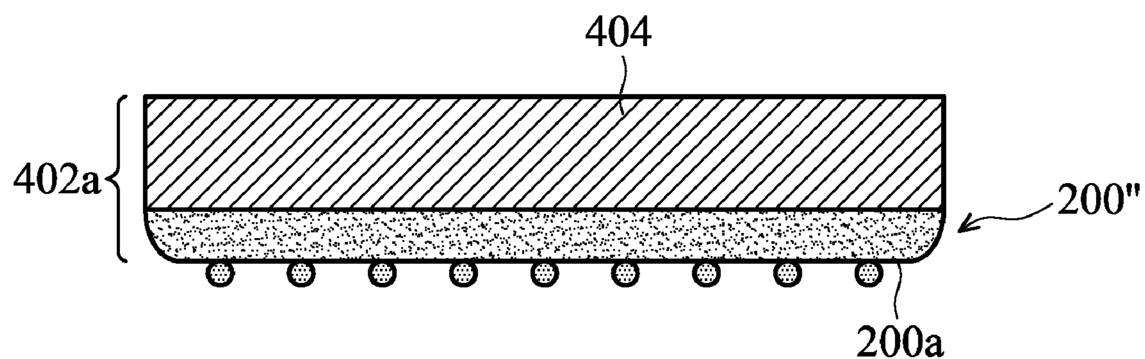

The method 100 continues with step 124 of removing the first adhesive layer remaining on the thinned device wafer 200". FIG. 2J is a cross-sectional view depicting a wafer clean process performed on the first side 200*a* of the thinned device wafer 200" to remove the first adhesive layer 202. In one embodiment, the wafer clean process is a wet process to chemically strip the first adhesive layer 202. In other embodiments, the first adhesive layer 202 may be removed by using thermal decomposition, peeling, plasma cleaning, pellet cleaning, or the like. Accordingly, the external contacts of the individual semiconductor chips formed on the first side 200*a* of the thinned wafer 200" for bonding to electrical terminals are exposed.

Figure 2K:
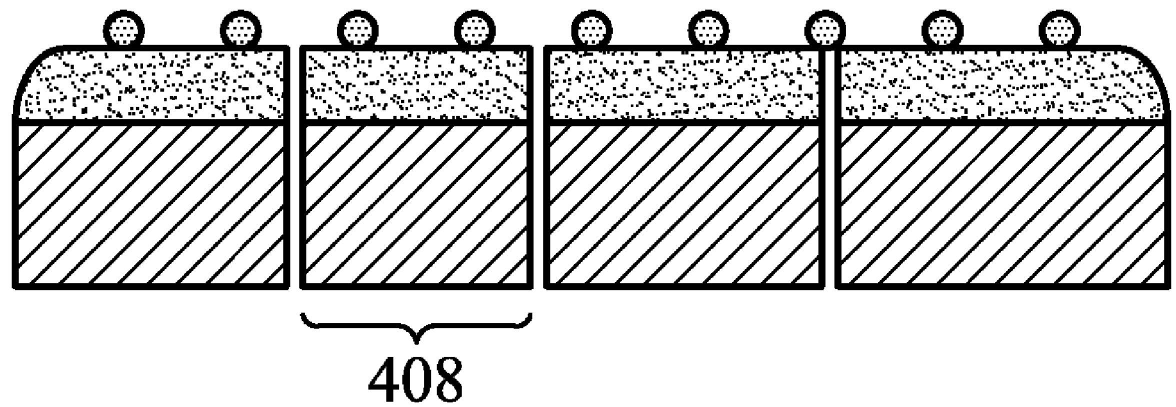

The method 100 continues with step 126 of dicing the molded stack 402*a* into individual die-to-die stacks in the usual manner along cutting lines. FIG. 2K is a cross-sectional view depicting a plurality of die-to-die stacks 408. After dicing, the stacked dies are mounted on an IC card through, for example, an anisotropically conductive connection film.

Figure 3A:
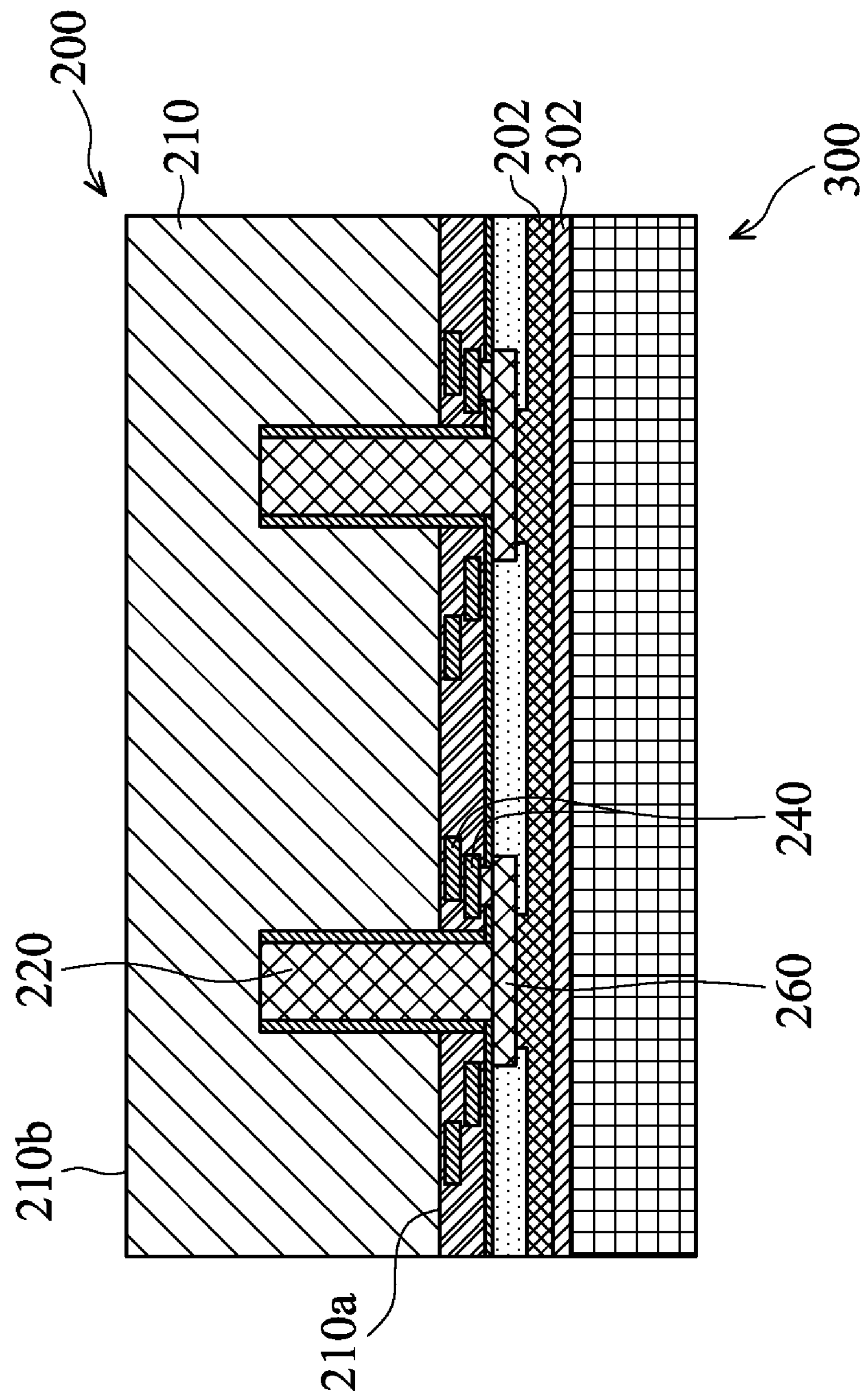
FIG. 3A to FIG. 3C are cross-sectional diagram depicting an exemplary embodiment of a method for handling a device wafer including through vias according to the method of bonding and detaching a temporary carrier.
Figure 3B:
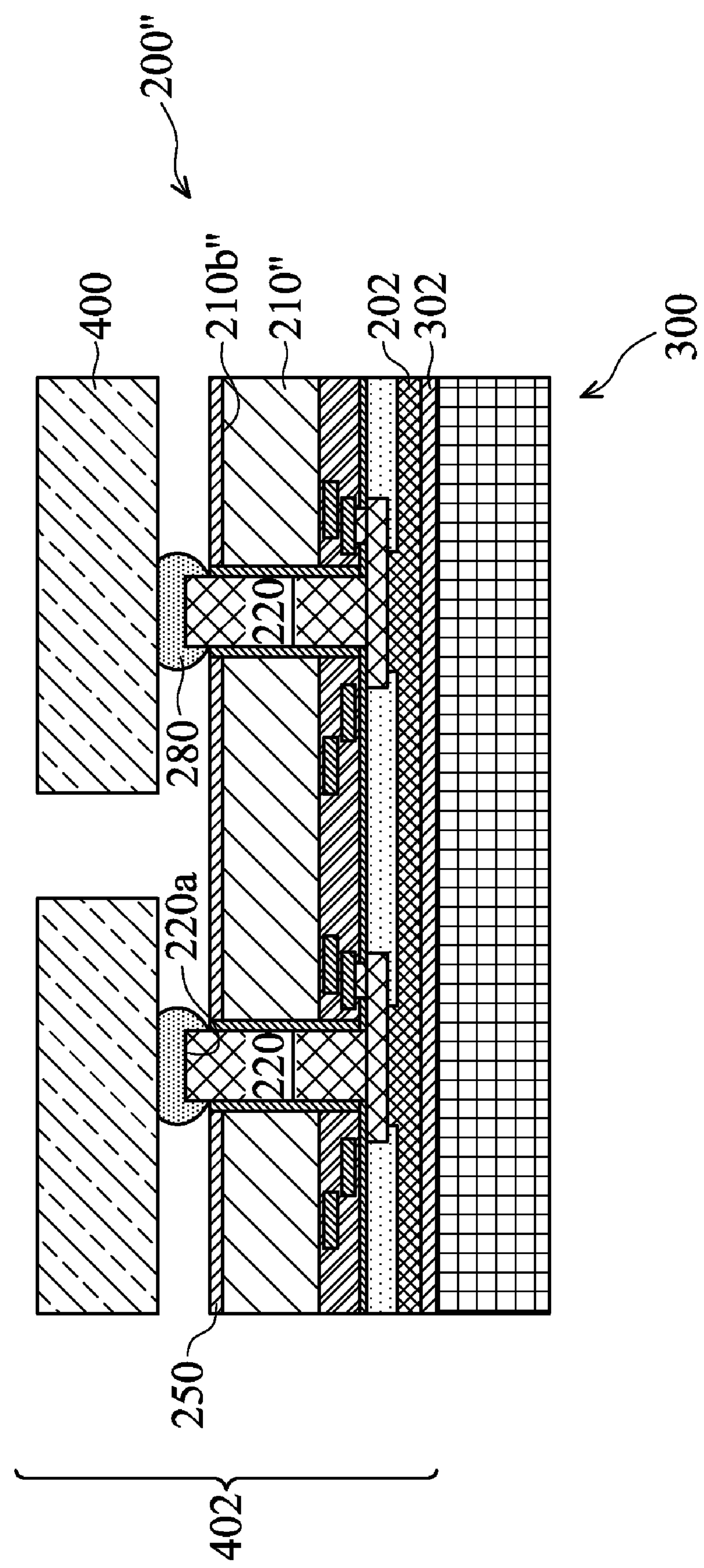
Figure 3C:
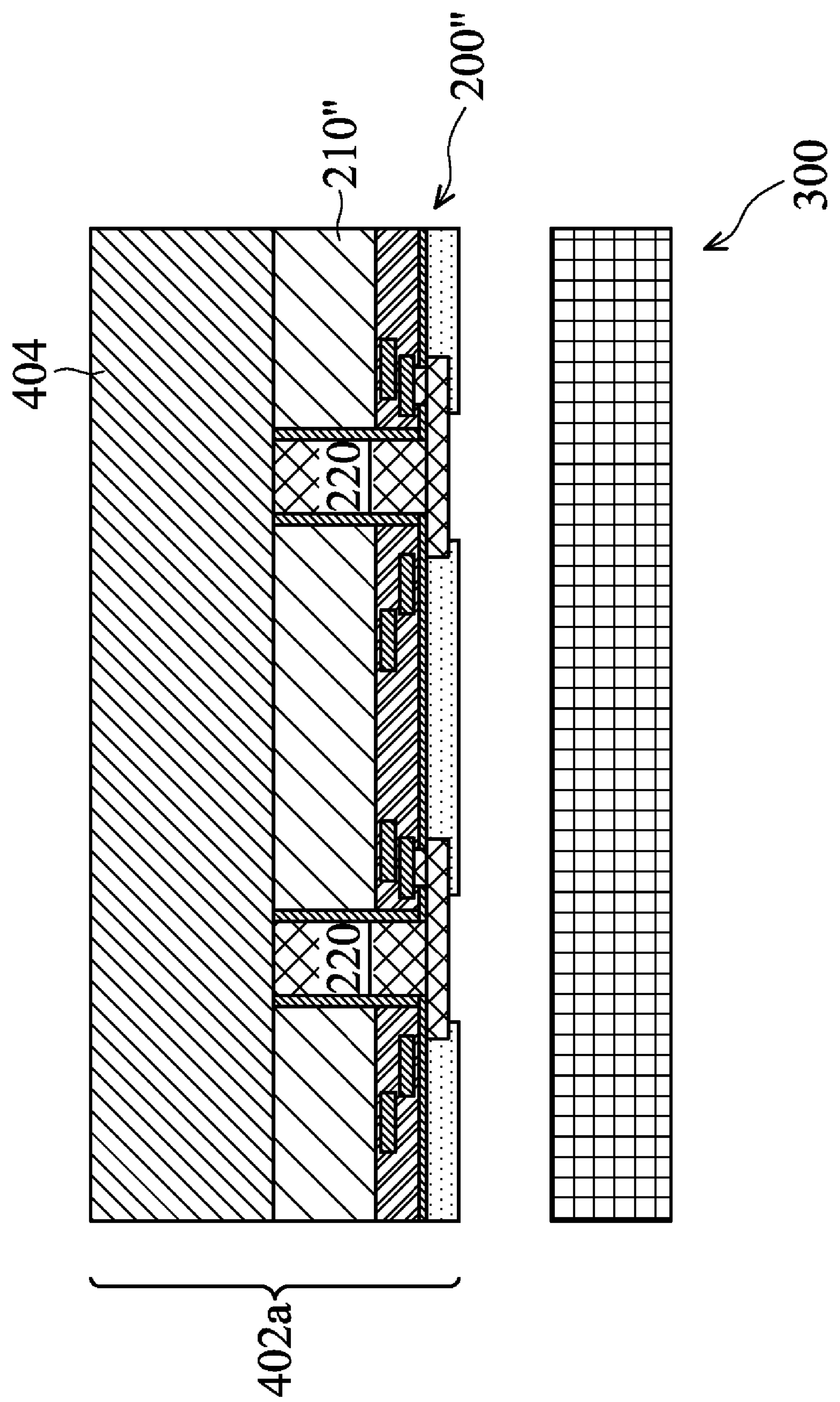

One or more of the individual dies of the device wafer 200 may have one or more through-substrate vias (TSVs) formed therein. FIG. 3A to FIG. 3C are cross-sectional diagram depicting an exemplary embodiment of fabricating a device wafer including through vias according to the method of FIG. 1 and FIGS. 2A to 2K, and explanation of the same or similar portions is omitted herein.

According to the steps 102 to 106 of the method 100, FIG. 3A is a cross-sectional diagram depicting the device wafer 200 including a plurality of through silicon vias (TSVs) bonded onto the carrier 300 through the adhesive layers 202 and 302.

The device wafer 200 comprises a semiconductor substrate 210 having a front surface 210*a* and a back surface 210*b*, wherein integrated circuits and interconnect structures are formed on the front surface 210*a*, and a plurality of through vias 220 passing through at least a part of the semiconductor substrate 210. Each through via 220 is a metal-filled plug extending from the front surface 210*a* toward the back surface 210*b* and reaching an intended depth. The through via 220 can electrically connect a bond pad 260 formed on an interconnect structure 240. The fabrication of the through vias 220 is performed before the fabrication of "first-level interconnection" which refers to a lowermost metal layer patterned in a lowermost inter-metal dielectric (IMD) layer overlying contact structures and transistors. Alternatively, the metal-filled via process is performed after the fabrication of interconnect structures.

According to the steps 108 to 112 of the method 100, FIG. 3B is a cross-sectional diagram depicting the molded stack 402*a* including a plurality of through silicon vias (TSVs). After the backside thinning process, one end 220*a* of the through via 220 is exposed and/or protruded from the back surface 210*b*" of the thinned substrate 210" after the wafer thinning process as shown in FIG. 2B. Backside isolation layer 250 is formed to cover the backside of thinned substrate 210". Conductive structures 280 such as solder bumps or copper bumps are formed over the ends 220*a* of the through vias 220 to bond to the dies 400. The conductive structures 280 may also include redistribution layers (RDLs) and pads, which can be formed before forming the solder bumps or copper bumps.

According to the steps 114 to 124 of the method 100, FIG. 3C is a cross-sectional diagram depicting the carrier 300 detached from the molded stack 402*a*. After coating the molding compound 404 over dies-to-wafer stack 402, the first adhesive layer 202 at the edge of the thinned device wafer 200" is removed by a cleaning method to expose the edge zone 300*e* of the carrier 300 and the second adhesive layer 302 adjacent the edge zone 300*e* (not shown in FIG. 3C). Then the second adhesive layer 302 is removed by decomposition using a light source 406 as depicted in FIG. 2H. Alternatively, the second adhesive layer 302 is removed by solvent resolved method. Next, the carrier 300 is detached from the molded stack 402*a* without causing damages. The method continues with step of removing the first adhesive layer 202 remaining on the thinned device wafer 200" through a wafer clean process, for example a wet process to chemically strip the first adhesive layer 202.

The foregoing has outlined features of several embodiments. Although utilization of a temporary carrier has been disclosed with reference to fabrication of a TSV device wafer, it is understood that the methods disclosed herein are applicable to other types of applications that require utilizing a temporary carrier such as in image sensors, microelectromechanical systems (MEMS), or other 3DIC applications.

Figure 4:
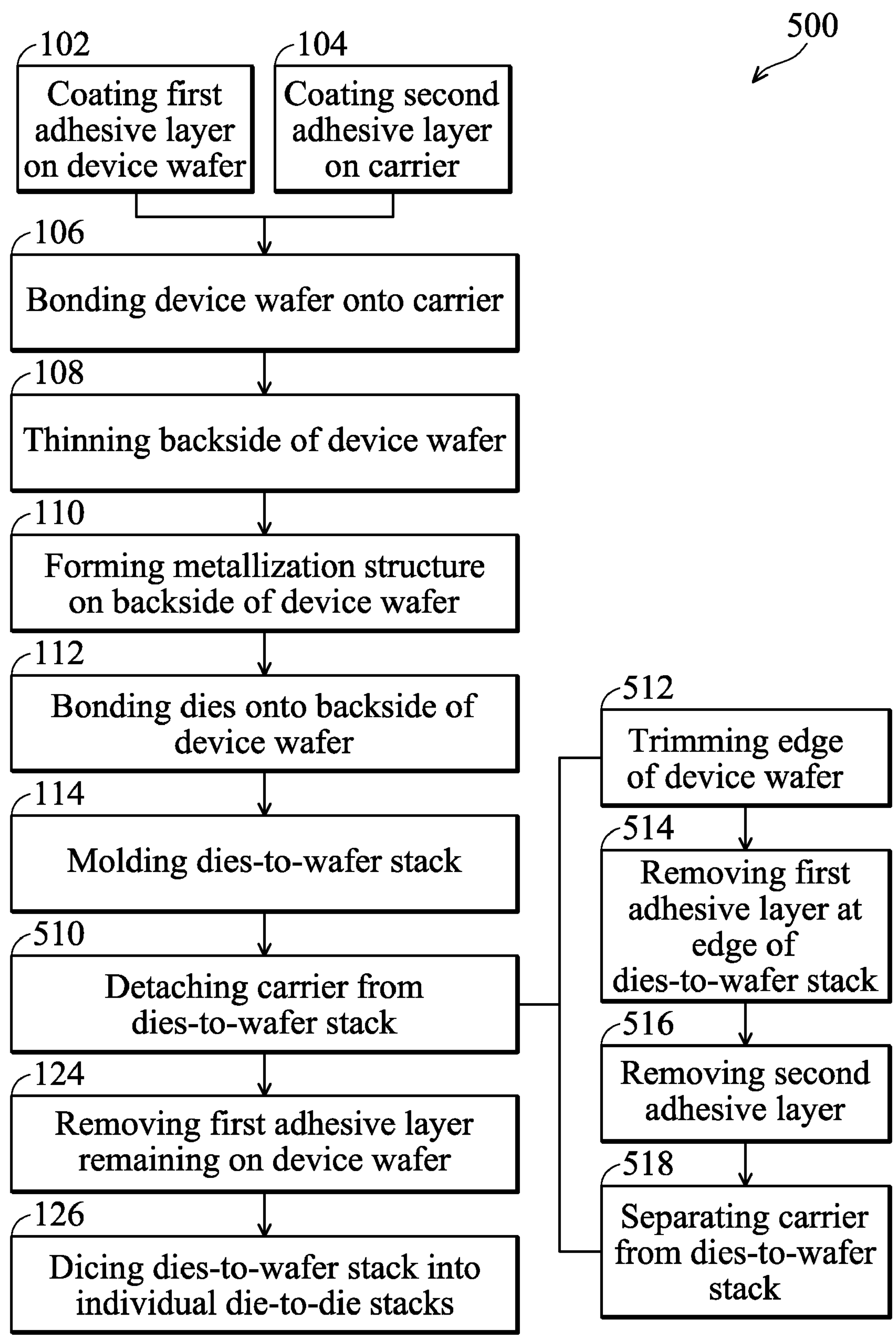
FIG. 4 is a flowchart of an exemplary embodiment of fabricating vertical die-to-die stacks including bonding and detaching a temporary carrier.

Referring to FIG. 4, illustrated is a flowchart of an exemplary embodiment of fabricating vertical die-to-die stacks including bonding and detaching a temporary carrier. Referring to FIG. 5A to FIG. 5G, illustrated are cross-sectional views of an exemplary embodiment of fabricating die-to-die stacks according to the method of FIG. 4. Explanation of the same or similar portions to FIG. 1 to FIG. 3 is omitted herein.

Figure 5A:
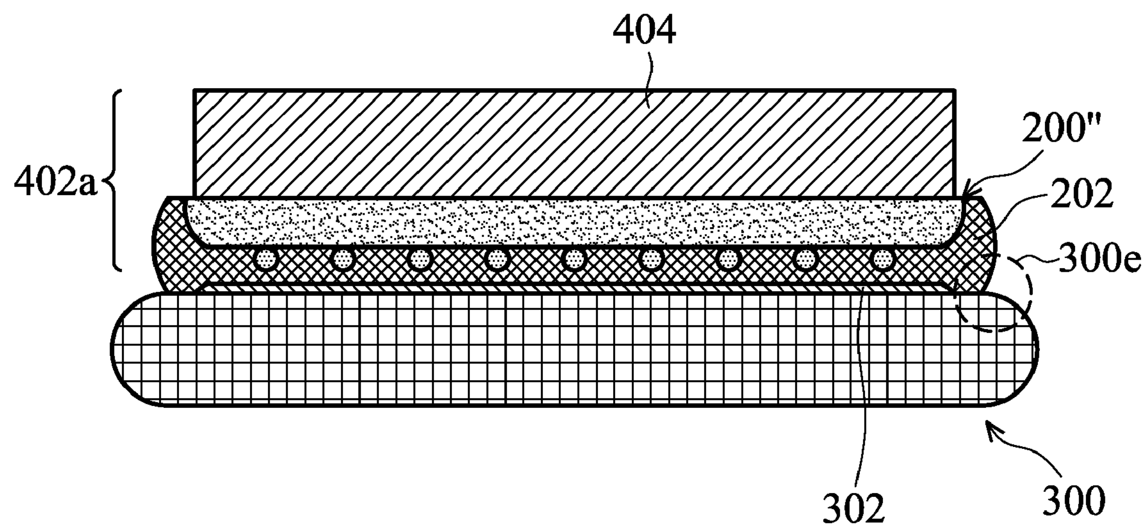
FIG. 5A to FIG. 5G are cross-sectional diagrams depicting an exemplary embodiment of fabricating die-to-die stacks at various stages according to the method of FIG. 4.

The method 500 begins with the steps 102 and 104 and then continuous with the steps 106 to 114 to form the molded stack 402*a* encapsulated with the molding compound 404 as depicted in FIG. 5A.

Figure 5B:
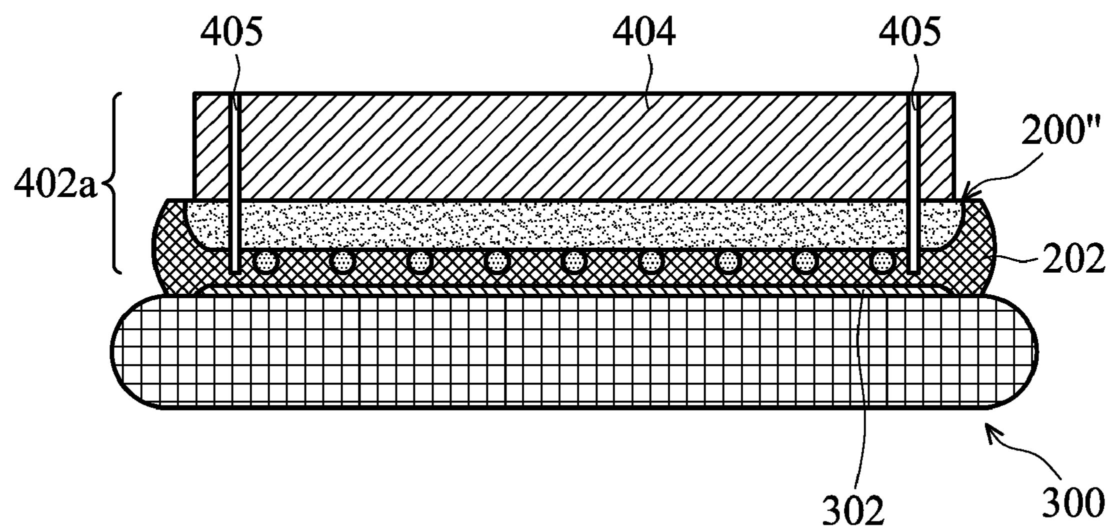

Next, the method 500 continues with step 510 of detaching the carrier 300 from the dies-to-wafer stack 402. FIG. 5B to FIG. 5E are cross-sectional views depicting various stages of the carrier detaching process. The step 510 begins with step 512 of trimming the edge of the device wafer 200" to form a channel 405 surrounding and adjacent to the edge of the molded stack 402*a* as depicted in FIG. 5B. The channel 405 cuts through the molding compound 404 and the thinned device wafer 200" and extends to a portion of the first adhesive layer 202 without touching the carrier 300 and/or the second adhesive layer 302 by using a cutting method, for example, using a laser cut tool. Alternatively, an etching process may be used for forming the channel 405. The diameter of the channel 405 may be less than 5 mm.

Figure 5C:
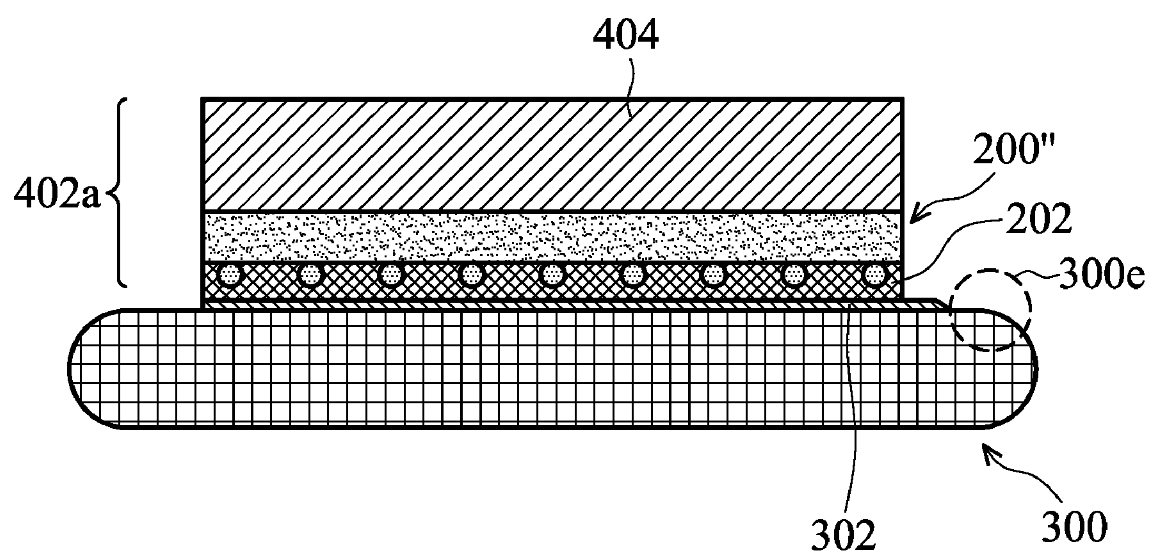

The step 510 continues with the step 514 of removing the first adhesive layer 202 at the edge of the thinned device wafer 200" by a cleaning method to expose the edge zone 300*e* of the carrier 300 and the second adhesive layer 302 adjacent the edge zone 300*e* as depicted in FIG. 5C. The cleaning method may be a chemical jetting process or a wet bench process employed to remove the portions surrounding the channel 405, including the molding compound 404, the thinned device wafer 200" and the first adhesive layer 202 adjacent the edge of the molded stack 402*a*. So that the second adhesive layer 302 adjacent to the edge zone 300*e* of the carrier 300 is exposed. The edge zone 300*e* of the carrier 300 is exposed as well.

Figure 5D:
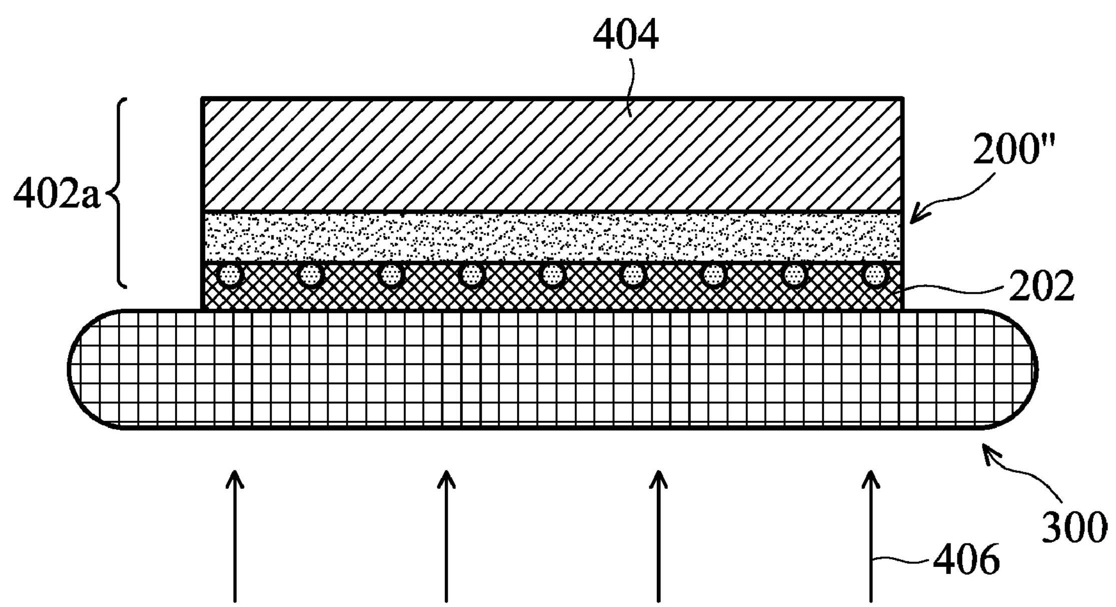

The step 510 continues with the step 516 of removing the second adhesive layer 302. In one embodiment, the second adhesive layer 302 is removed by decomposition using a light source 406 as depicted in FIG. 5D. The light source 406 is directed at carrier 300 and is emitted to pass through the carrier 300, so that the second adhesive layer 302 is decomposed after absorbing the light-form energy. The light source 406 may include IR (infrared light), laser, radiation lamp, or the like. In other embodiment, the second adhesive layer 302 is removed by solvent resolved method.

Figure 5E:
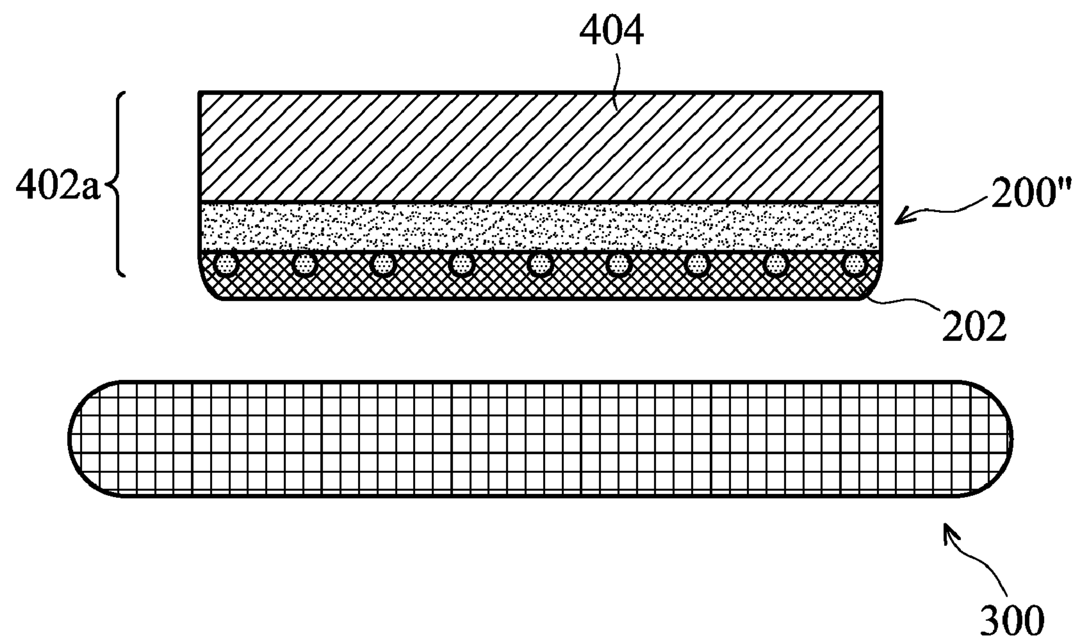

Typically after wafer-level testing has been completed, the step 510 continues with the step 518 of separating the carrier 300 and the dies-to-wafer stack 402 as depicted in FIG. 5E. Since the second adhesive layer 302 is removed by decomposition or solvent, it become more easily to detach the carrier 300 from the thinned device wafer 200" without causing damages. The detaching process may use any appropriate de-bonding processes, such that the semiconductor structures in the thinned device wafer 200" retain their integrity. For example, the detaching process uses a solvent, by suing UV irradiation or by being pulled off to remove the carrier 300 from the first adhesive layer 202.

Figure 5F:
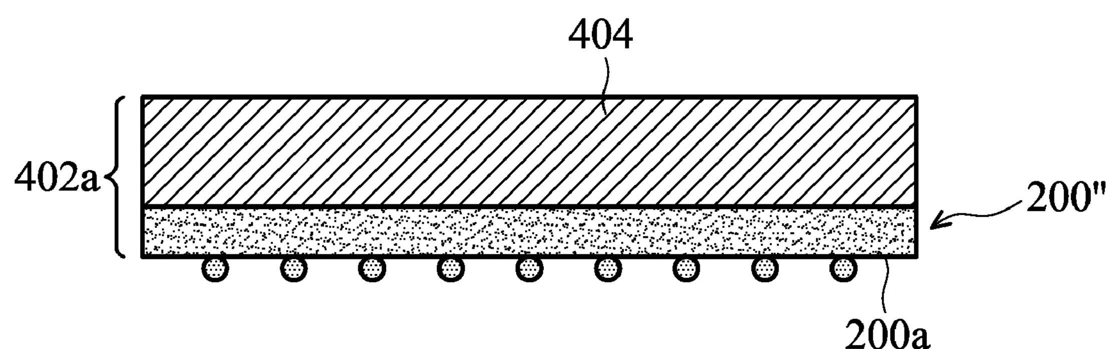
Figure 5G:
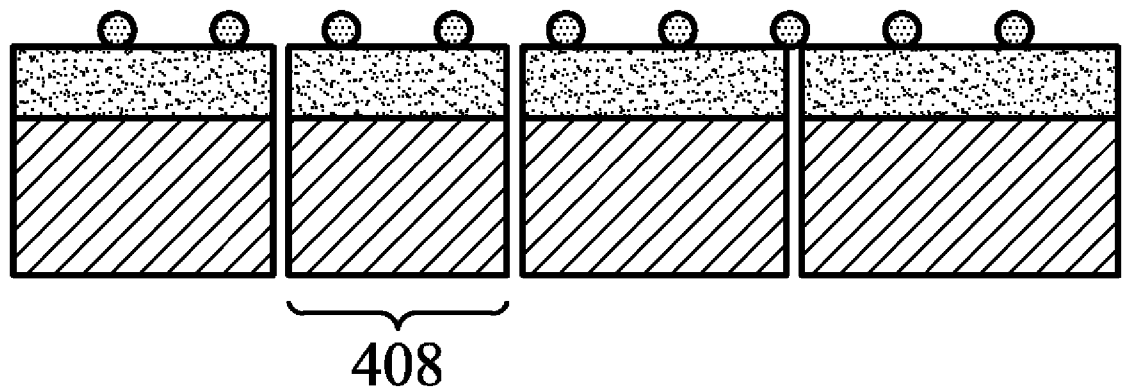

The method 500 continues with the step 124 of removing the first adhesive layer remaining on the thinned device wafer 200". FIG. 5F is a cross-sectional view depicting a wafer clean process performed on the first side 200*a* of the thinned device wafer 200" to remove the first adhesive layer 202. Accordingly, the external contacts of the individual semiconductor chips formed on the first side 200*a* of the thinned wafer 200" for bonding to electrical terminals are exposed. The method 500 continues with step 126 of dicing the molded stack 402*a* into individual die-to-die stacks 408 in the usual manner along cutting lines. FIG. 5G is a cross-sectional view depicting a plurality of die-to-die stacks 408. After dicing, the stacked dies are mounted on an IC card through, for example, an anisotropically conductive connection film.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A method of fabricating a stacked device, comprising:
- providing a wafer having a first surface and a second surface opposite to the first surface, wherein the first surface is coated with a first adhesive layer;
- providing a carrier coated with a second adhesive layer, exposing the edge zone of the carrier;
- bonding the first surface of the wafer to the carrier through the first adhesive layer and the second adhesive layer, wherein the edge zone of the carrier is covered by the first adhesive layer;
- thinning the wafer from the second surface, forming a thinned wafer;
- bonding a plurality of dies onto the thinned wafer;
- removing the first adhesive layer adjacent the edge of the thinned wafer, exposing the edge zone of the carrier and the second adhesive layer adjacent the edge zone of the carrier;
- applying a light-form energy to decompose the second adhesive layer;
- detaching the carrier from the wafer; and
- removing the first adhesive layer remaining on the first surface of the wafer.

2. The method of claim 1, wherein the light-form energy comprises IR (infrared radiation), laser, or UV (ultraviolet).

3. The method of claim 1, wherein removing the first adhesive layer adjacent the edge of the thinned wafer comprising a clean process performed on the edge of the thinned wafer.

4. The method of claim 1, wherein the first adhesive layer is formed of a wet-chemical removable adhesive material.

5. The method of claim 1, wherein the second adhesive layer is formed of a light-decomposable adhesive material, or a thermal decomposed adhesive material.

6. The method of claim 1, wherein the second adhesive layer is formed of a solvent-resolved adhesive material.

7. The method of claim 1, wherein the wafer comprises:
- a semiconductor substrate having a front surface and a back surface;
- a through via filled with a conductive material passing through at least a part of the semiconductor substrate; and
- integrated circuits formed on the front surface of the semiconductor substrate.

8. The method of claim 7, wherein after thinning the wafer, an end of the through via is exposed on the back surface of the semiconductor substrate.

9. The method of claim 1, wherein the first adhesive layer is a multi-layered adhesive structure.

10. A method of fabricating a stacked device, comprising:
- providing a wafer having a first surface and a second surface opposite to the first surface, wherein the first surface is coated with a first adhesive layer;
- providing a carrier coated with a second adhesive layer, exposing the edge zone of the carrier;
- bonding the first surface of the wafer to the carrier through the first adhesive layer and the second adhesive layer, wherein the edge zone of the carrier is covered by the first adhesive layer;
- thinning the wafer from the second surface, forming a thinned wafer;
- bonding a plurality of dies onto the thinned wafer, forming a dies-to-wafer stack;
- providing a molding compound on the dies-to-wafer stack, forming a molded stack;
- forming a channel adjacent the edge of the molded stack, wherein the channel passes through the molding compound, the edge of the wafer and a portion of the first adhesive layer;
- removing portions of the molding compound, the edge of the wafer and the first adhesive layer surrounding the channel, exposing the edge zone of the carrier and the second adhesive layer adjacent the edge zone of the carrier;
- removing the second adhesive layer;
- detaching the carrier from the wafer; and
- removing the first adhesive layer remaining on the first surface of the wafer.

11. The method of claim 10, wherein the channel has a diameter less than 5 mm.

12. The method of claim 10, wherein removing the second adhesive layer is applying a light-form energy or a thermal energy to decompose the second adhesive layer.

13. The method of claim 12, wherein the light-form energy comprises IR (infrared radiation) or laser.

14. The method of claim 10, wherein removing the second adhesive layer is using a solvent to resolve the second adhesive layer.

15. The method of claim 10, wherein the first adhesive layer is formed of a wet-chemical removable adhesive material.

16. The method of claim 10, wherein the first adhesive layer is a multi-layered adhesive structure.

17. The method of claim 10, wherein the wafer comprises:
- a semiconductor substrate having a front surface and a back surface;

a through via filled with a conductive material passing through at least a part of the semiconductor substrate; and integrated circuits formed on the front surface of the semiconductor substrate.

18. The method of claim 17, wherein after thinning the wafer, an end of the through via is exposed on the back surface of the semiconductor substrate.

19. A method of handling a device wafer comprising:

providing a device wafer comprising a semiconductor substrate with a front surface and a back surface, wherein a through via filled with a conductive material is formed in the semiconductor substrate from the front surface toward the back surface to extend into a depth of the semiconductor substrate;

forming a first adhesive layer over the front surface of the semiconductor substrate, covering the edge of the device wafer;

providing a carrier coated with a second adhesive layer, exposing the edge zone of the carrier;

bonding the device wafer to the carrier through the first adhesive layer and the second adhesive layer, wherein the edge zone of the carrier is covered by the first adhesive layer;

thinning the device wafer from the back surface of the semiconductor substrate to expose an end of the through via;

forming a metallization structure overlying the back surface of the semiconductor substrate to electrically connecting the exposed end of the through via;

bonding a die onto the device wafer to electrically connecting to the metallization structure;

removing the first adhesive layer adjacent the edge of the device wafer, exposing the edge zone of the carrier;

removing the second adhesive layer;

detaching the carrier from the device wafer; and removing the first adhesive layer.

20. The method of claim 19, wherein removing the second adhesive layer is applying a light-form energy to decompose the second adhesive layer.

* * * * *